() United States Patent  (10) Patent No.: US 7,939,915 B2
Ho et al. (45) Date of Patent: May 10, 2011

(54) CONTACT ETCH STOP FILM

(75) Inventors: Hok Min Ho, Shanghai (CN); Ching Tien Ma, Shanghai (CN); Woei Ji Song, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/578,374

(22) Filed: Oct. 13, 2009

(65) Prior Publication Data

US 2010/0029090 A1 Feb. 4, 2010

Related U.S. Application Data

(62) Division of application No. 11/611,347, filed on Dec. 15, 2006, now Pat. No. 7,629,673.

(30) Foreign Application Priority Data

Nov. 30, 2006 (CN) .......................... 2006 1 0119026

(51) Int. Cl.
 *H01L 23/58* (2006.01)
(52) U.S. Cl. ................. 257/637; 257/638; 257/E21.267
(58) Field of Classification Search .......... 257/637–640, 257/E21.267, E21.294; 438/761, 758, 778, 438/786, 787, 791
See application file for complete search history.

(56) References Cited

U.S. PATENT DOCUMENTS

| 6,255,233 | B1 * | 7/2001 | Smith et al. ................... | 438/786 |
| 6,541,367 | B1 * | 4/2003 | Mandal .......................... | 438/622 |
| 6,884,464 | B2 | 4/2005 | Luo et al. | |
| 7,629,673 | B2 | 12/2009 | Ho et al. | |

FOREIGN PATENT DOCUMENTS

CN 1378247 A 11/2002

OTHER PUBLICATIONS

Notice of Allowance for U.S. Appl. No. 11/611,347, mailed on Jul. 29, 2009, 6 pages.
Final Office Action for U.S. Appl. No. 11/611,347, mailed on Apr. 1, 2009, 8 pages.
Non-Final Office Action for U.S. Appl. No. 11/611,347, mailed on Oct. 30, 2008, 6 pages.
Office Action of Chinese Application No. 200610119026.3 dated Oct. 10, 2008, 4 pages total (English translation not included).
Requirement for Restriction/Election for U.S. Appl. No. 11/611,347, mailed on Aug. 7, 2008, 7 pages.

* cited by examiner

*Primary Examiner* — Zandra Smith
*Assistant Examiner* — Paul E Patton
(74) *Attorney, Agent, or Firm* — Kilpatrick Townsend and Stockton LLP

(57) ABSTRACT

A system and method for improved dry etching system. According to an embodiment, the present invention provides a partially completed integrated circuit device. The partially completed integrated circuit device includes a semiconductor substrate having a surface region. The partially completed integrated circuit device also includes an etch stop layer overlying the surface region. The etch stop layer is characterized by a thickness having at least a first thickness portion and a second thickness portion. The second thickness portion includes an etch stop surface region. The partially completed integrated circuit device additionally includes a silicon dioxide material provided within the first thickness portion of the etch stop layer. The partially completed integrated circuit device includes a silicon nitride material provided within the second thickness portion of the etch stop layer. In addition, the partially completed integrated circuit device includes a profile characterized by the silicon dioxide material in the first thickness portion changing to the silicon nitride material in the second thickness portion.

16 Claims, 5 Drawing Sheets

US 7,939,915 B2

CONTACT ETCH STOP FILM

CROSS-REFERENCES TO RELATED APPLICATIONS

The present application is a division of U.S. application Ser. No. 11/611,347, filed on Dec. 15, 2006, entitled "Novel Contact Etch Stop Film", which claims priority to Chinese Patent No. 200610119026.30 filed on Nov. 30, 2006, both commonly assigned and hereby incorporated by reference for all purposes.

BACKGROUND OF THE INVENTION

The present invention is directed to integrated circuits and their processing for the manufacture of semiconductor devices. More particularly, the invention provides a method and a device for an etching process using an etch stop region for the manufacture of integrated circuits. Merely by way of example, the invention has been applied to the chemical dry etching process for the manufacture of integrated circuits. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is chemical dry etching process used for the manufacture of integrated circuits in a cost effective and efficient way.

Etching is an important process in semiconductor manufacturing. Etching involves removing selected regions from the surface of a wafer using a plasma process that may include a physical process, chemical process, or the combination thereof. Usually a goal of etching is to faithfully reproduce masking patterns. To achieve this goal, it is often desirable to for the etching process to be highly selective both in patterns and depth, which is often achieve through chemical dry etching.

Chemical drying etching usually involves generating reactive species in plasma, providing these species to the surface of material being etched, species being absorbed, reacting of these species on the surface to form volatile by-product, absorbing or the by-product by the surface, and diffusing of the desorbed species diffusing into gas. There are many various dry-etch systems to accomplish these steps. For example, dry-etch systems include barrel etchers, downstream etchers, parallel-electrode (planar) reactor etchers, stacked parallel-electrode etchers, hexode batch etchers, magnetron ion etchers, etc.

Regardless of type of dry-etch systems being used, an aspect for an etching process is a highly selective etching depth. There are various methods for controlling the etch depth. For example, a layer of "etch stop" may be used during the etching process to control etching depth. An etch stop layer is usually consisted of materials that feature drastically different etch characteristics from the material to be etched. The etch stop layer is generally placed underneath the etched material to stop etching process.

Although the use of etch stop layers is fairly common, there are many limitations. As an example, etch stop layers are often difficult to form for providing selectivity between materials that may have common characteristics. That is, it is often difficult to selectively remove different dielectric materials from each other. Depending upon application, convention etching process utilizing an etch stop layer may adversely affect the characteristics of the wafer being etched.

Therefore, it is desirable to have an improved system and method for etching.

BRIEF SUMMARY OF THE INVENTION

According to the present invention, techniques directed to integrated circuits and their processing for the manufacture of semiconductor devices are provided. More particularly, the invention provides a method and device for an etching process using an etch stop region for the manufacture of integrated circuits. Merely by way of example, the invention has been applied to the chemical dry etching process for the manufacture of integrated circuits. But it would be recognized that the invention has a much broader range of applicability.

According to an embodiment, the present invention provides a partially completed integrated circuit device, e.g., memory, microprocessor. The partially completed integrated circuit device includes a semiconductor substrate (e.g., silicon wafer, silicon on insulating, epitaxial silicon) having a surface region. The partially completed integrated circuit device also includes an etch stop layer overlying the surface region. In a preferred embodiment, the etch stop layer is "graduated." The term "graduated" is intended to mean that a certain concentration of one or more species within a thickness of the etch stop layer changes in a graduated manner. Of course, this meaning is not intended to unduly limit the scope of the invention from any interpretation inconsistent with those of ordinary skill in the art.

In a specific embodiment, the etch stop layer is characterized by a thickness having at least a first thickness portion and a second thickness portion. Depending upon the embodiment, there may also be other portions provided in the etch stop layer. The second thickness portion includes an etch stop surface region, which include an entire surface region or a portion of the surface region. The partially completed integrated circuit device additionally includes a silicon dioxide material (e.g., pure silicon dioxide, thermal oxide) provided within the first thickness portion of the etch stop layer. Additionally, the partially completed integrated circuit device includes a silicon nitride material (e.g., SiN) provided within the second thickness portion of the etch stop layer. In addition, the partially completed integrated circuit device includes a profile characterized by the silicon dioxide material in the first thickness portion changing to the silicon nitride material in the second thickness portion. Moreover, the partially completed integrated circuit device includes an etchable material overlying the etch stop surface region. The etchable material is characterized by a silicon dioxide bearing material.

According to another embodiment, the present invention provides a method for forming a contact region. The method includes the step of providing a substrate. The method additionally includes the step of forming an etch stop layer including a single continuous region having a pure silicon dioxide material in a first thickness portion, a silicon oxynitride material in a second portion, and a silicon nitride material in a third thickness portion to form the etch stop layer. Additionally, the method includes forming an etchable material overlying the third thickness portion of the etch stop layer.

According to another embodiment, the present invention provides a method of forming a single continuous etch stop layer on a partially completed integrated circuit device comprising. The method includes the step of providing a substrate. The substrate is characterized by a silicon bearing material. The method also includes the step of introducing an oxygen bearing species to form a first thickness portion overlying the substrate. The first thickness portion is characterized by a silicon dioxide material. The method additionally includes the step of introducing a nitrogen bearing species to form a second thickness portion overlying the first thickness portion. The second thickness portion is characterized by a silicon oxynitride material. The method also includes the step of removing oxygen bearing species to form substantially a third thickness portion overlying the second thickness portion. The third thickness portion is characterized by a silicon nitride material. The single continuous etch stop layer is characterized by a thickness having a first thickness portion, a second thickness portion, and a third thickness portion.

It is to be appreciated that according to an embodiment, the present invention provides an improved etch stop layer to be used during the process of manufacturing integrated circuits. For example, the present invention provides good etch stop ability and good via contacts at the same time. Moreover, according to an embodiment, the etch stop mechanism according to the present is relatively economical and practical to manufacture.

Many benefits are achieved by way of the present invention over conventional techniques. For example, the present technique provides an easy to use process that relies upon conventional technology. In some embodiments, the method provides a dry etch system. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and device for the etching process for the manufacture of integrated circuits. Merely by way of example, the invention has been applied to the chemical dry etching process for the manufacture of integrated circuits. But it would be recognized that the invention has a much broader range of applicability.

An important aspect for an etching process is a highly selective etching depth. There are various methods for controlling the etch depth. For example, a layer of "etch stop" may be used during the etching process to control etching depth. An etch stop layer is usually consisted of materials that feature drastically different etch characteristic from the material to be etch. The etch stop layer is generally placed underneath the etched material to stop etching process. Using etch stop layer that is consisted of materials that that feature drastically different etch characteristic from the material to be etched has an advantage of capable of effectively stopping the etching process. However, depending on the application, using etch stop layer that is consisted of materials that that feature drastically different etch characteristic from the material to be etched also has disadvantages. For example, in applications where etching is used to create contact via the etch stop layer may produce undesirable results.

Figure 1A:
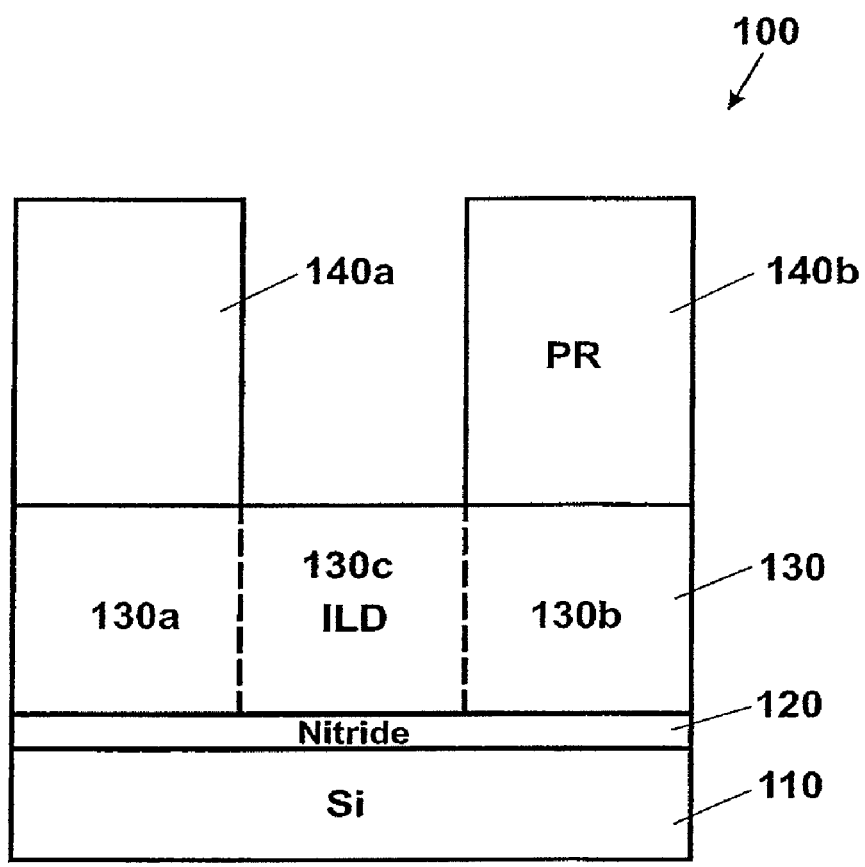
FIG. 1A is a simplified diagram illustrating a conventional etch stop layer.

FIG. 1A is a simplified diagram illustrating a conventional etch stop layer. A prepared substrate material 100 been partially processed. The prepared substrate material 100 includes a silicon layer 110, a nitride layer 120, an inter dielectric (ILD) layer 130, and photoresists 140a and 140b. On top of the silicon layer 110 overlays the nitride layer 120. The nitride layer 120 is used as an etch stop layer. On top of the nitride 120 is the ILD layer 130. During the etching process, the ILD layer 130 is to be etched away during the etching process. The ILD layer 130 is usually consisted of material such as silicon dioxide. On top of the ILD layer 130 are the photo resists 140a and 140b. Photoresists 140a and 140b are used during the etching process to select which areas are to be etched away. Photoresists 140a and 140b prevents areas 130a and 130b of ILD layers that is directly underneath photoresists 140a and 140b from being etched way during the etching process. During the etching process, only the area 130c of the ILD layer, which is not covered by photoresists 140a and 140b, is etched way. When the ILD layer 130 is etched away during the etching process, the nitride layer 120 acts as an etch stop. Since nitride is drastically different from silicon dioxide, the plasma species that etches the ILD materials has little effect on the nitride. When the etching process is completed, photoresists 140a and 140b are removed.

Figure 1B:
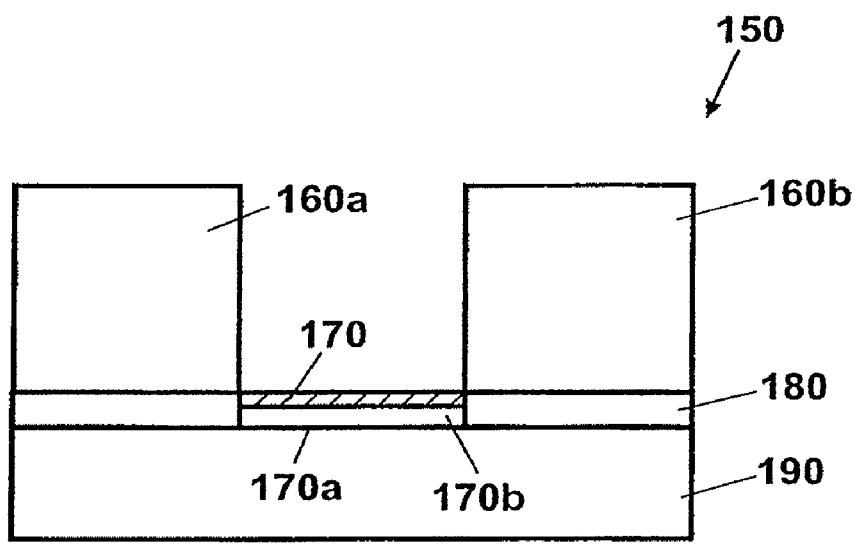
FIG. 1B is a simplified diagram illustrating a conventional partially processed substrate after the etching process and photoresist removal.

FIG. 1B is a simplified diagram illustrating a conventional partially processed substrate after the etching process and photoresist removal. The partially processed substrate 150 includes ILD layers 160a and 160b, a nitride layer 180, and a silicon layer 190. The ILD layers 160a and 160b are results of the etching process. For example, the ILD layer 160a corresponds to the areas 130a of the ILD layer 130 in FIG. 1A. The area 130a of the ILD layer 130 was blocked is blocked by the photoresist 140a from being etched away. Similarly, the ILD layer 160b corresponds to the areas 130b of the ILD layer 130 in FIG. 1A. The area 130b of the ILD layer 130 was blocked is blocked by the photoresist 140b from being etched away. The area between the ILD layers 160a and 160b are no longer present, as the area 130c of the ILD layer in FIG. 1A is etched away. During the etching process, the nitride layer 120 from FIG. 1A effectively stops the etching process. Only a portion 170 of the nitride layer 180 is etched away. A portion 170b of the nitride layer 180 remains. The silicon layer 190 underneath the nitride layer 180 remains unchanged by the etching process.

Etching process is often not perfectly selective. For example, in an application where the area 130c of the ILD layer 130 in Figure is etched way to provide a space between the ILD layers 160a and 160b for a via plug to implement a gate for a MOS transistor, it is desirable to etch away nitride layer during the etching process so that a good contact between a gate metal and the silicon layer can be made. Because the nitride layer 120 in FIG. 1A effectively stops the plasma etching, only the portion 170 of the nitride layer 120 in FIG. 1A is etched away. The portion 170b of the nitride layer 180 remains on top of the silicon layer 190, creating an interface 170a between the portion 170b of the nitride layer 180 and the silicon layer 190. Depending upon applications, the interface 170a may have undesirable effects. For example, in an application where a gate metal contacts the portion 170b of the nitride layer 180, electrical charges are trapped at the interface 170a, causing undesirable leakage and exhibit poor hot carrier injection (HCI) characteristics. As an example, poor HCI characteristics usually leads to, inter alia, long-term degradation and poor reliability. Therefore, it is desirable to eliminate the interface 170a between the nitride layer 170 and the silicon layer 180.

Figure 2A:
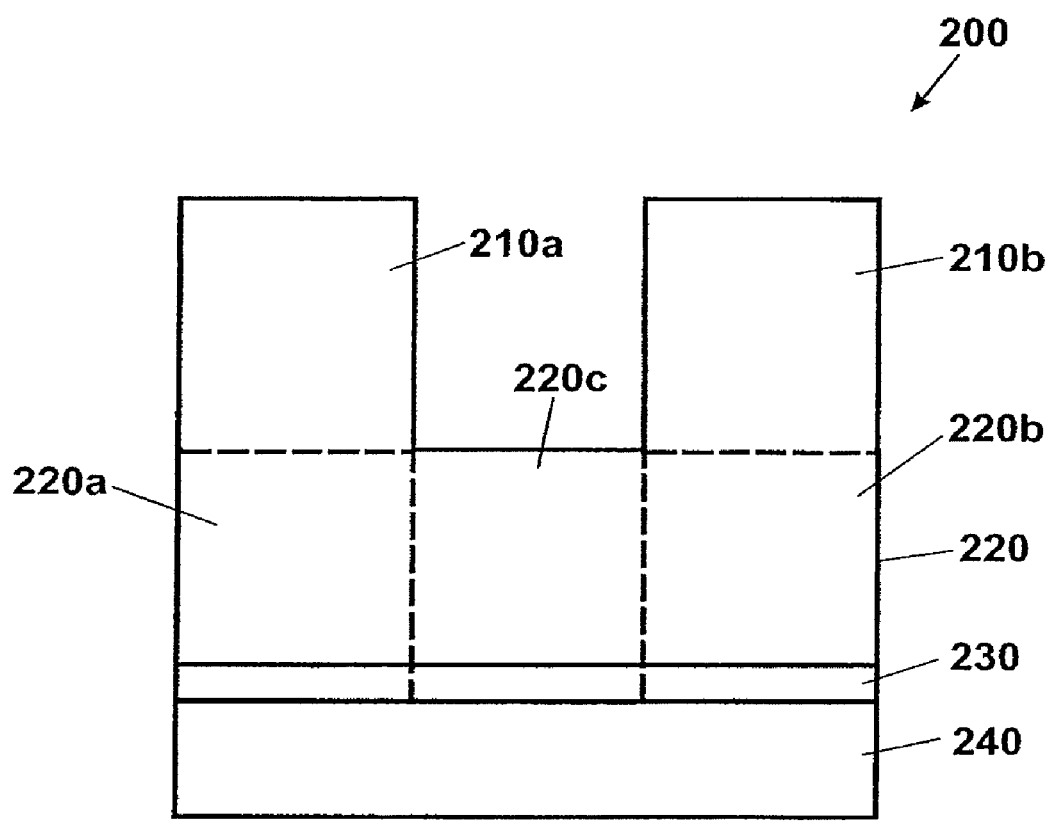
FIG. 2A is a simplified diagram illustrating a conventional etch stop layer implemented with oxide material.

One way to reduce undesirable leakage and to improve HCI characteristics is to eliminate the interface 170a by using different material for the etch stop layer. For example, materials that have similar characteristics as the silicon layer may be used. FIG. 2A is a simplified diagram illustrating a conventional etch stop layer implemented with oxide material. A prepared substrate material 200 been partially processed. The prepared substrate material 200 includes a silicon layer 240, a silicon dioxide layer 230, an ILD layer 220, and photoresists 210a and 210b. On top of the silicon layer 240 overlays the silicon dioxide layer 230. The silicon dioxide layer 230 is used as an etch stop layer. On top of the silicon dioxide layer 230 is the ILD layer 220. During the etching process, the ILD layer 220 is to be etched away during the etching process. The ILD layer 220 is usually consisted of material such as silicon dioxide. On top of the ILD layer 220 are the photoresists 210a and 210b. Photoresists 210a and 210b are used during the etching process to select which areas are to be etched away. Photoresists 210a and 210b prevents areas 220a and 220b of ILD layers 220 that is directly underneath photoresists 210a and 210b from being etched way during the etching process. During the etching process, only the area 220c of the ILD layer, which is not covered by photoresists 210a and 210b, is etched way. When the ILD layer 220c is etched away during the etching process, the silicon dioxide layer 230 acts as an etch stop. Since silicon oxide at the silicon dioxide layer 230 is similar to the ILD layer 220 in material, a plasma species that is effective against the ILD layer 220 is also effective against the silicon dioxide layer 230, which is used as the etch stop layer. As a result, the silicon dioxide layer 230 sometimes does not effectively stop etching.

Figure 2B:
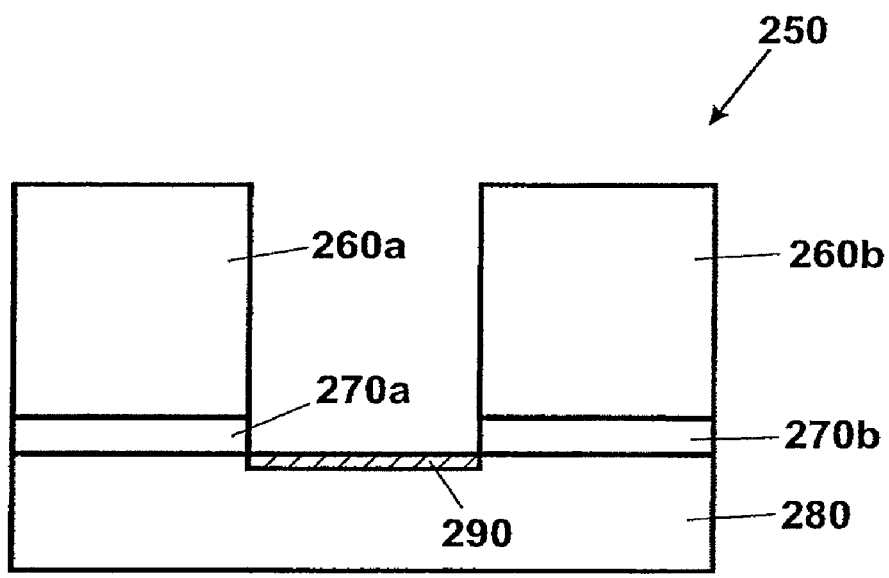
FIG. 2B is a simplified diagram illustrating a conventional partially processed substrate after the etching process and photoresist removal.

FIG. 2B is a simplified diagram illustrating a conventional partially processed substrate after the etching process and photoresist removal. The partially processed substrate 250 includes ILD layers 260a and 260b, silicon oxide layers 270a and 270b, and a silicon layer 280. The ILD layers 260a and 260b are results of the etching process. For example, the ILD layer 260a corresponds to the areas 220a of the ILD layer 220 in FIG. 2A. The area 220a of the ILD layer 220 was blocked is blocked by the photoresist 210a from being etched away. Similarly, the ILD layer 260b corresponds to the areas 220b of the ILD layer 220 in FIG. 2A. The area 220b of the ILD layer 220 was blocked is blocked by the photoresist 210b from being etched away. The area between the ILD layers 260a and 260b are no longer present, as the area 220c of the ILD layer 220 in FIG. 2A is etched away. During the etching process, the silicon dioxide layer 230 from FIG. 2A does not effectively stop the etching process. As a result, as shown on FIG. 2B, the silicon dioxide 230 layer from FIG. 2A is etched through, leaving a gap between silicon oxide layer 270a and 270b. In addition, because of the poor etch stopping capability of the silicon dioxide layer 230, a portion 290 of the silicon layer 280 is also etched away. The partially process substrate 250 does not have an interface between a nitride layer and a silicon layer as seen on the partially processed substrate 150. However, since the portion 290 of the silicon layer 280 is etched away, the partially processed substrate 250 provides a poor via contact. For example, the partially processed substrate 250 may have junction leakage because the portion 290 of the silicon layer 280 is etched away. Because the poor capability in effectively stopping the etching process, silicon dioxide is usually not used as a material for etch stop.

Therefore, it is desirable to have an improved etch stop that provides good etch stopping capability and good contact at the same time.

Figure 3A:
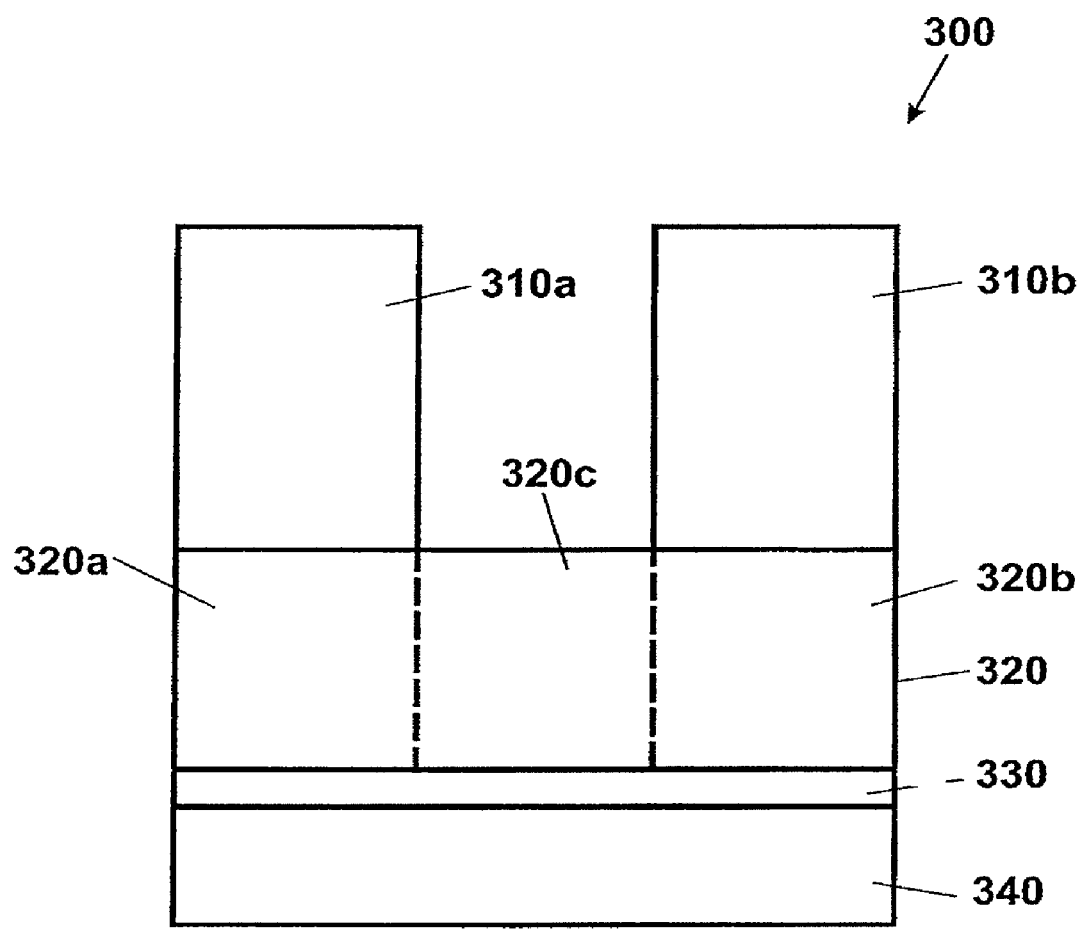
FIG. 3A is a simplified diagram illustrating an improved system for an etch system according to an embodiment of the present invention.

FIG. 3A is a simplified diagram illustrating an improved system for an etch system according to an embodiment of the present invention. This diagram is merely an example, which should not unduly limit the scope of the claims. One of ordinary skill in the art would recognize many variations, alternatives, and modifications. The prepared substrate material 300 includes a silicon layer 340, an etch stop layer 330, an ILD layer 320, and photoresists 310a and 310b. On top of the silicon layer 340 overlays the etch stop layer 330. The silicon dioxide layer 330 is used as an etch stop layer. On top of the etch stop layer 330 is the ILD layer 320. During the etching process, the ILD layer 320 is to be etched away during the etching process. The ILD layer 320 is usually consisted of material such as silicon dioxide. On top of the ILD layer 320 are the photoresists 310a and 310b. Photoresists 310a and 310b are used during the etching process to select which areas are to be etched away. Photoresists 310a and 310b prevents areas 320a and 320b of ILD layers 320 that is directly underneath photoresists 310a and 310b from being etched way during the etching process. During the etching process, only the area 320c of the ILD layer, which is not covered by photoresists 310a and 310b, is etched way. When the ILD layer 320c is etched away during the etching process, the etch stop layer 330 acts as an etch stop. According to an embodiment of the present invention, the etch stop layer 330 consists of different materials in accordance to a graduated profile.

Figure 3B:
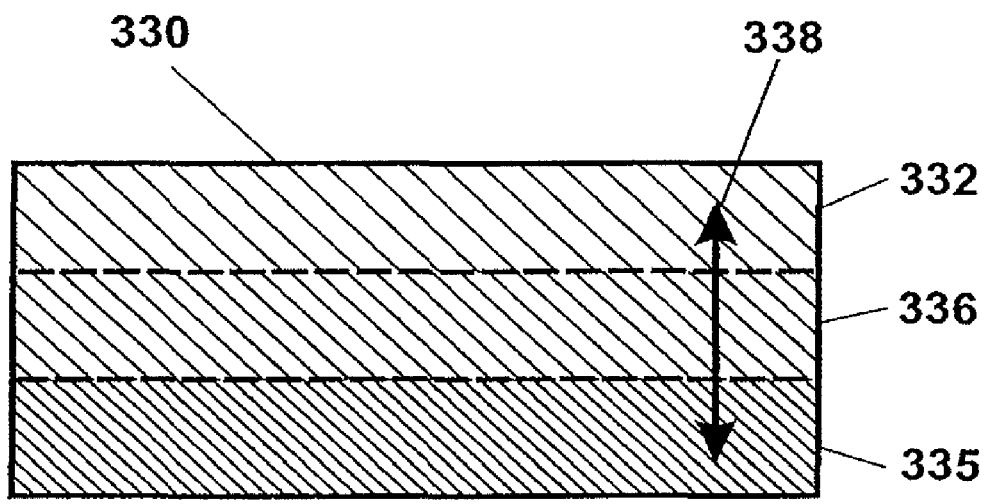
FIG. 3B illustrates a simplified diagram of an etch stop layer according to an embodiment of the present invention.

FIG. 3B illustrates a simplified diagram of an etch stop layer according to an embodiment of the present invention. This diagram is merely an example, which should not unduly limit the scope of the claims. One of ordinary skill in the art would recognize many variations, alternatives, and modifications. According to an embodiment, the etch stop layer 330 has a thickness of approximately 410 angstroms. The etch stop layer 330 consists of different materials according to a profile 338. In a preferred embodiment, the profile 335 is continuously graduated. According to the profile 338, the top portion 332 of the etch stop layer 330 consists substantially entirely of silicon nitride. The bottom portion 335 of the etch stop layer 330 consists substantially entirely of silicon dioxide. The material make up of the etch stop layer 330 gradually changes from silicon dioxide at the bottom portion 335 to the silicon nitride at the top portion 332. For example, the middle portion 336 includes silicon oxynitride material. At the top end of the middle portion 336, the silicon oxynitride material includes more nitride and less oxide. At the bottom end of the middle portion 336, the silicon oxynitride material includes more oxide and less nitride.

Figure 3C:
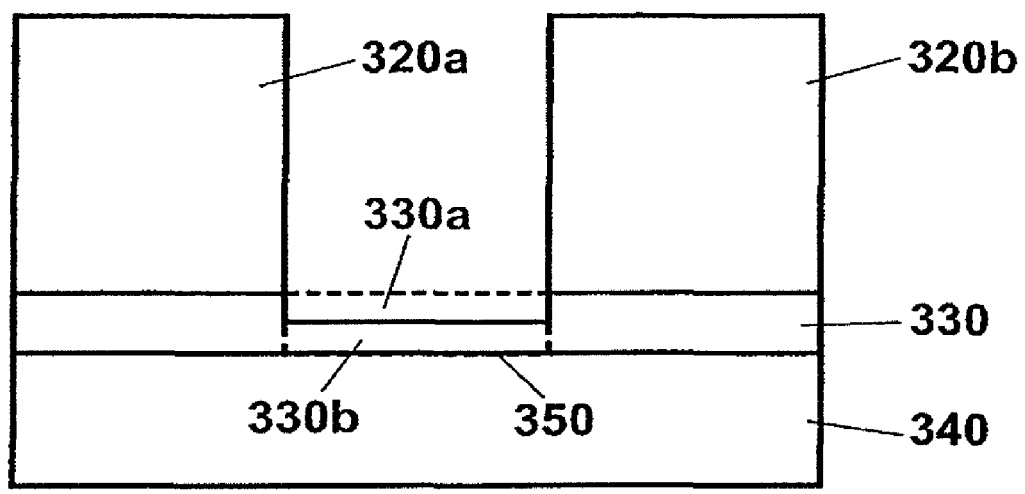
FIG. 3C is a simplified diagram illustrating a partially processed substrate after the etching process and photoresist removal according to an embodiment of the present invention.

FIG. 3C is a simplified diagram illustrating a partially processed substrate after the etching process and photoresist removal according to an embodiment of the present invention. This diagram is merely an example, which should not unduly limit the scope of the claims. One of ordinary skill in the art would recognize many variations, alternatives, and modifications. The partially processed substrate 300 includes ILD layers 320a and 320c, an etch stop layer 330, and a silicon layer 340. The ILD layers 320a and 320b are results of the etching process. For example, the ILD layer 320a corresponds to the areas 320a off the ILD layer 320 in FIG. 3A. The area 320a of the ILD layer 320 was blocked is blocked by the photoresist 310a from being etched away. Similarly, the ILD layer 320b corresponds to the areas 320b of the ILD layer 320 in FIG. 2A. The area 320b of the ILD layer 320 was blocked is blocked by the photoresist 310b from being etched away. The area between the ILD layers 320a and 320b are no longer present, as the area 320c of the ILD layer 320 in FIG. 3A is etched away. During the etching process, a portion 330a of the etch stop layer 330 is also etched away. Because the portion 330a is primarily consisted for silicon nitride, the top portion effectively stops the etching process, which is to etch away the ILD layer 320. As seen on FIG. 3C, the lower portion 330b of the etch stop layer 330 is not etched away and remains on the partially process substrate 300. As merely an example, the etch stop layer has been described throughout the present specification and more particularly below.

An embodiment of etch stop layer according to the present invention is superior than etch stopping mechanisms illustrated according FIG. 1A and FIG. 2A. For example, compared to the nitride based etch stop layer as illustrated according to FIG. 1A, the etch stop layer 330 does not share an interface between nitride and silicon. The contact between the etch stop layer 330 and the underlying silicon layer 340 is an interface 350, which is an interface between silicon and silicon dioxide. Depending on applications, the interface 350, because of the similarity between silicon and silicon, does not trap electrons and provides excellent between the silicon layer 340 and a gate metal. As a result, good HCI characteristics are achieved. According to an embodiment, the present invention is also superior than the etch stopping mechanism as illustrated at FIG. 2A. For example, because the etch stop layer 330 is consisted primarily of nitride at its top portion 332, the etch stop layer 330 offers much better etch stop capability compared to the silicon dioxide etch stop layer on FIG. 2A. The silicon layer 340 is not etched away at all.

Figure 4:
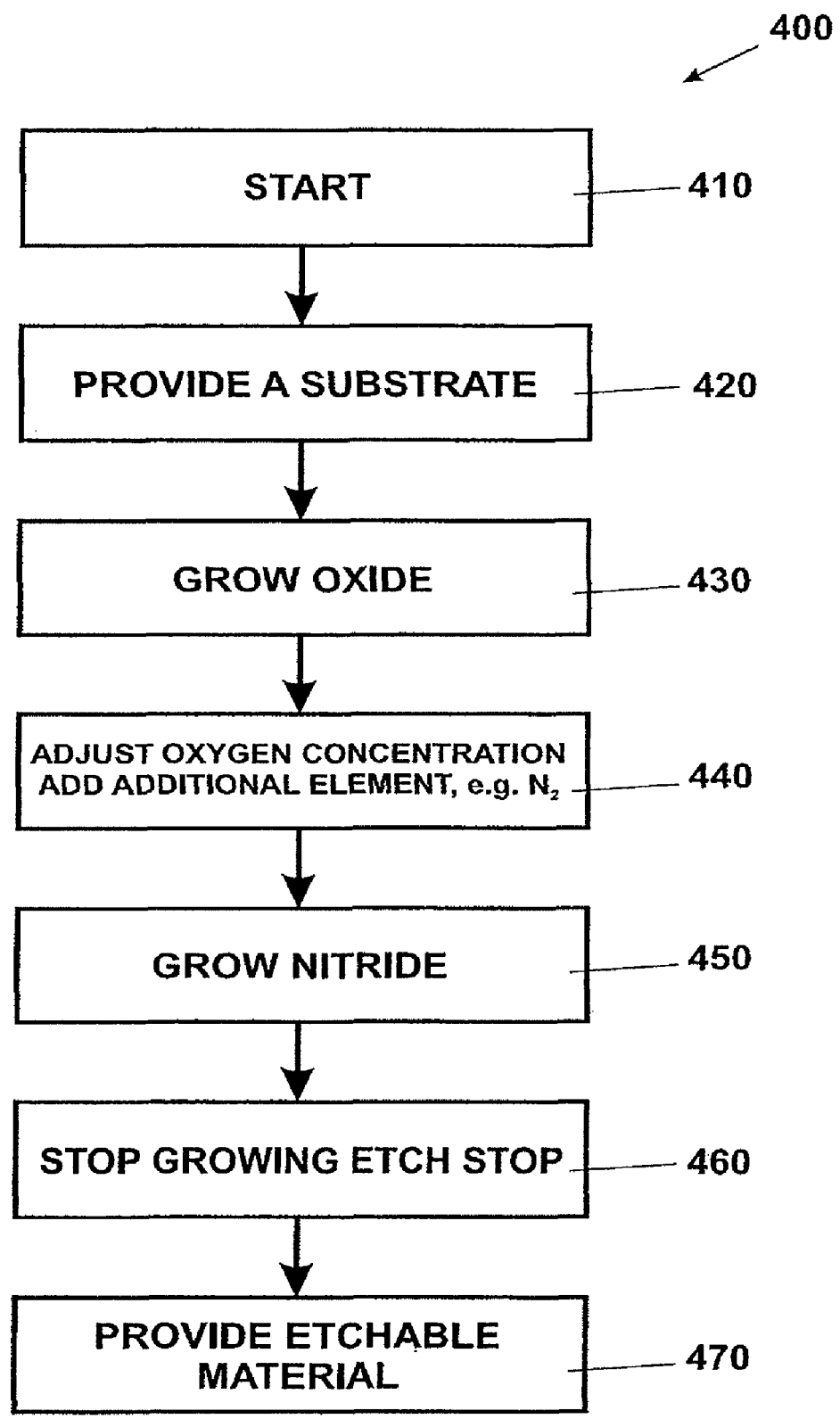
FIG. 4 is a simplified diagram illustrating a method of manufacturing an etch stop layer according to an embodiment of the present invention.

FIG. 4 is a simplified diagram illustrating a method of manufacturing an etch stop layer according to an embodiment of the present invention. This diagram is merely an example, which should not unduly limit the scope of the claims. One of ordinary skill in the art would recognize many variations, alternatives, and modifications. The manufacturing method 400 starts at step 410. At step 420, a substrate that consists primarily of silicon is provided. For example, the substrate is the silicon layer 340 in FIG. 3A. Next, at step 430, silicon dioxide is grown from the substrate. For example, the substrate is subjected to oxygen gas at a high temperature for the silicon dioxide to grow. At step 440, concentration of oxygen gas is reduced and nitrogen gas is introduced. For example, silicon oxynitride material is grown on top the silicon dioxide. According to an embodiment, the make up of the silicon oxynitride material is associated with the concentration and the ratio thereof of nitrogen and oxygen gases. At step 450, the substrate is subject to only nitrogen gas, and silicon nitride is grown. At step 460 where the growing of etch stop layer stops, an etch layer with a profile is formed. For a preferred embodiment, the profile is continuously graduated. For example, the etch stop layer 330 in FIG. 3B is formed at step 460. The etch stop layer 330 consists of different materials according to the profile 338. According to the profile 338, the top portion 332 of the etch stop layer 330 consists substantially entirely of silicon nitride. The bottom portion 335 of the etch stop layer 330 consists substantially entirely of silicon dioxide. The material make up of the etch stop layer 330 gradually changes from silicon dioxide at the bottom portion 335 to the silicon nitride at the top portion 332. After the etch stop layer is formed, etchable material is provided at step 470. For example, etchable material is the ILD layer material that consists primarily of silicon dioxide.

FIG. 4A is merely an example, which should not unduly limit the scope of the claims. One of ordinary skill in the art would recognize many variations, alternatives, and modifications. For example, after etchable material is provided at step 470, photoresists is added on top of the etchable material.

According to an embodiment, the present invention provides a partially completed integrated circuit device. The partially completed integrated circuit device includes a semiconductor substrate having a surface region. The partially completed integrated circuit device also includes an etch stop layer overlying the surface region. The etch stop layer is characterized by a thickness having at least a first thickness portion and a second thickness portion. The second thickness portion includes an etch stop surface region. The partially completed integrated circuit device additionally includes a silicon dioxide material provided within the first thickness portion of the etch stop layer. Additionally, the partially completed integrated circuit device includes a silicon nitride material provided within the second thickness portion of the etch stop layer. In addition, the partially completed integrated circuit device includes a profile characterized by the silicon dioxide material in the first thickness portion changing to the silicon nitride material in the second thickness portion. Moreover, the partially completed integrated circuit device includes an etchable material overlying the etch stop surface region. The etchable material is characterized by a silicon dioxide bearing material. For example, the partially completed integrated circuit device may be implement according to FIG. 3.

According to another embodiment, the present invention provides a method for forming a contact region. The method includes the step of providing a substrate. The method additionally includes the step of forming an etch stop layer including a continuous region having a pure silicon dioxide material in a first thickness portion, a silicon oxynitride material in a second portion, and a silicon nitride material in a third thickness portion to form the etch stop layer. Additionally, the method includes forming an etchable material overlying the third thickness portion of the etch stop layer. For example, the method for forming a contact region may be implement according to FIG. 3.

According to another embodiment, the present invention provides a method of forming a etch stop layer on a partially completed integrated circuit device. The method includes the step of providing a substrate. The substrate is characterized by a silicon bearing material. The method also includes the step of introducing an oxygen bearing species to form a first thickness portion overlying the substrate. The first thickness portion is characterized by a silicon dioxide material. The method additional includes the step of introducing an nitrogen bearing species to form a second thickness portion overlying the first thickness portion. The second thickness portion is characterized by a silicon oxynitride material. The method also includes the step of removing oxygen bearing species to form substantially a third thickness portion overlying the second thickness portion. The third thickness portion is characterized by a silicon nitride material. The etch stop layer is characterized by a thickness having a first thickness portion, a second thickness portion, and a third thickness portion. For example, the method of forming an single continuous etch stop layer on a partially completed integrated circuit device may be implement according to FIG. 3.

It is to be appreciated that according to an embodiment, the present invention provides an improved etch stop layer to be used during the process of manufacturing integrated circuits. For example, the present invention provides good etch stop ability and good via contacts at the same time. Moreover, according to an embodiment, the etch stop mechanism according to the present is relatively economical and practical to manufacture.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a contact region for an integrated circuit device, the method comprising:
   providing a substrate;
   forming an etch stop layer including a single continuous region having a silicon dioxide material in a first thickness portion overlying the substrate, a silicon oxynitride material in a second thickness portion directly overlying the silicon dioxide material, and a silicon nitride material in a third thickness portion overlying the silicon oxynitride material; and
   forming an etchable material overlying the third thickness portion of the etch stop layer.

2. The method of claim 1 wherein the forming an etch stop layer is performed in a single chamber.

3. The method of claim 1 wherein the forming an etch stop layer is performed in vacuum.

4. The method of claim 1 further comprising forming at least one photoresist overlying the etchable material.

5. The method of claim 1, wherein the third thickness portion includes an etch stop surface region.

6. The method of claim 1, wherein the etch stop layer changes gradually from the silicon dioxide material to the silicon oxynitride material to the silicon nitride material, the silicon oxynitride having more oxide and less nitride at a first proximity of the silicon dioxide material and the silicon oxynitride having more nitride and less oxide at a second proximity of the silicon nitride material.

7. The method of claim 1, wherein the substrate comprises a silicon material.

8. The method of claim 1, wherein the etchable material is characterized by a silicon dioxide bearing material.

9. The method of claim 1 wherein the etch stop layer is overlying a surface region of the substrate.

10. The method of claim 1 wherein the etch stop layer is on and in contact with a surface region of the substrate.

11. A method of forming a single continuous etch stop layer for an integrated circuit device comprising:
    providing a substrate, the substrate comprising a silicon bearing material;
    introducing an oxygen bearing species to form a first thickness portion overlying the substrate to cause the first thickness portion to comprise a silicon dioxide material;
    introducing an nitrogen bearing species to form a second thickness portion directly overlying the first thickness portion to cause the second thickness portion to comprise a silicon oxynitride material; and
    changing a concentration of the oxygen bearing species to form a third thickness portion overlying the second thickness portion to cause the third thickness portion to comprise a silicon nitride material; and whereupon at least the first thickness portion, the second thickness portion, and the third thickness portion form the single continuous etch stop layer having a total thickness.

12. The method of claim 11 wherein the total thickness is less than 410 Angstroms.

13. The method of claim 11 wherein the introducing an oxygen bearing species comprises subjecting an oxygen gas to a microwave source.

14. The method of claim 11 wherein the introducing a nitrogen bearing species comprises subjecting a nitrogen gas to a microwave source.

15. The method of claim 11, wherein the single continuous etch stop layer changes gradually from the silicon dioxide material to the silicon oxynitride material to the silicon nitride material, the silicon oxynitride having more oxide and less nitride at a first proximity of the silicon dioxide material and the silicon oxynitride having more nitride and less oxide at a second proximity of the silicon nitride material.

16. The method of claim 1, wherein the etch stop layer comprises a thickness less than 410 Angstroms.

* * * * *